United States Patent
Lin (10) Patent No.: US 9,450,061 B2
(45) Date of Patent: Sep. 20, 2016

(54) METAL BUMP STRUCTURE FOR USE IN DRIVER IC AND METHOD FOR FORMING THE SAME

(71) Applicant: HIMAX TECHNOLOGIES LIMITED, Tainan (TW)

(72) Inventor: Chiu-Shun Lin, Tainan (TW)

(73) Assignee: HIMAX TECHNOLOGIES LIMITED, Tainan (TW)

( * ) Notice: Subject to any disclaimer, the term of this patent is extended or adjusted under 35 U.S.C. 154(b) by 50 days.

(21) Appl. No.: 14/269,213

(22) Filed: May 5, 2014

(65) Prior Publication Data
US 2014/0327134 A1 Nov. 6, 2014

Related U.S. Application Data

(60) Provisional application No. 61/820,152, filed on May 6, 2013.

(51) Int. Cl.
*H01L 29/43* (2006.01)
*H01L 23/00* (2006.01)

(52) U.S. Cl.
CPC .............. *H01L 29/43* (2013.01); *H01L 24/11* (2013.01); *H01L 24/13* (2013.01); *H01L 24/03* (2013.01); *H01L 24/05* (2013.01); *H01L 2224/0345* (2013.01); *H01L 2224/03614* (2013.01); *H01L 2224/03912* (2013.01); *H01L 2224/0401* (2013.01); *H01L 2224/05009* (2013.01); *H01L 2224/05022* (2013.01); *H01L 2224/05027* (2013.01); *H01L 2224/05124* (2013.01); *H01L 2224/05166* (2013.01); *H01L 2224/05572* (2013.01); *H01L 2224/05582* (2013.01); *H01L 2224/05647* (2013.01); *H01L 2224/1134* (2013.01); *H01L 2224/1146* (2013.01); *H01L 2224/1147* (2013.01); *H01L 2224/1181* (2013.01); *H01L 2224/11825* (2013.01); *H01L 2224/11848* (2013.01); *H01L 2224/13006* (2013.01); *H01L 2224/1357* (2013.01); *H01L 2224/13139* (2013.01); *H01L 2224/13144* (2013.01); *H01L 2224/13147* (2013.01); *H01L 2224/13164* (2013.01); *H01L 2224/13552* (2013.01); *H01L 2224/13562* (2013.01);

(Continued)

(58) Field of Classification Search
CPC ..... H01L 24/11; H01L 21/768; H01L 29/43; H01L 23/00
See application file for complete search history.

(56) References Cited

U.S. PATENT DOCUMENTS 7,601,566 B2 10/2009 Sakakura
7,612,456 B2 11/2009 Fujii (Continued)

FOREIGN PATENT DOCUMENTS

CN 101325167 A 12/2008
JP 2007103953 A 4/2007

(Continued)

*Primary Examiner* — Matthew W Such
*Assistant Examiner* — Krista Soderholm
(74) *Attorney, Agent, or Firm* — Winston Hsu; Scott Margo (57) ABSTRACT

A metal bump structure for use in a driver IC includes a passivation layer disposed on a metal pad and defining a recess on the metal pad, an adhesion layer in said recess, on the metal pad and on the passivation layer, a metal bump disposed in the recess and completely covering the adhesion layer, and a capping layer disposed on the metal bump and completely covering the metal bump so that the metal bump is not exposed to an ambient atmosphere.

16 Claims, 6 Drawing Sheets

(52) U.S. Cl.
CPC ........... *H01L2224/13582* (2013.01); *H01L 2224/13611* (2013.01); *H01L 2224/13644* (2013.01); *H01L 2224/13655* (2013.01); *H01L 2224/13664* (2013.01); *H01L 2924/0105* (2013.01); *H01L 2924/01028* (2013.01); *H01L 2924/15788* (2013.01)

(56) References Cited

U.S. PATENT DOCUMENTS

| | | | |
|---|---|---|---|
| 7,786,581 B2 | 8/2010 | Kang | |
| 8,501,614 B1* | 8/2013 | Shih et al. | 438/612 |
| 2004/0166661 A1* | 8/2004 | Lei | 438/614 |
| 2006/0055037 A1 | 3/2006 | Park | |
| 2007/0075422 A1 | 4/2007 | Fujii | |
| 2007/0080453 A1 | 4/2007 | Jang | |
| 2007/0267745 A1* | 11/2007 | Chao et al. | 257/737 |
| 2008/0050905 A1* | 2/2008 | Uchida et al. | 438/614 |
| 2013/0026614 A1 | 1/2013 | Yu | |
| 2013/0043585 A1 | 2/2013 | Wakiyama et al. | |
| 2013/0193570 A1* | 8/2013 | Kuo et al. | 257/737 |

FOREIGN PATENT DOCUMENTS

| | | |
|---|---|---|
| KR | 1020040081732 A | 9/2004 |
| KR | 1020050060032 A | 6/2005 |
| KR | 1020060024928 A | 3/2006 |
| KR | 1020070042492 A | 4/2007 |
| KR | 100850212 B1 | 8/2008 |
| KR | 1020080102545 A | 11/2008 |
| KR | 1020110090332 A | 8/2011 |
| KR | 101140481 B1 | 4/2012 |
| TW | 200511541 | 3/2005 |
| TW | 201044526 | 12/2010 |
| TW | 201044527 | 12/2010 |

\* cited by examiner

METAL BUMP STRUCTURE FOR USE IN DRIVER IC AND METHOD FOR FORMING THE SAME

CROSS REFERENCE TO RELATED APPLICATIONS

This application claims the benefit of U.S. Provisional Application Ser. No. 61/820,152, filed May 6, 2013.

BACKGROUND OF THE INVENTION

1. Field of the Invention

The present invention generally relates to a metal bump structure and a method for forming the same. In particular, the present invention is directed to a metal bump structure particularly for use in a driver IC to be protected from an ambient atmosphere, free of a galvanic effect in the presence of high electric field or halogen as well as a method for forming the same.

2. Description of the Prior Art

In some electronic circuits, metal bumps are used to form connections between two groups of circuits. In order to lower the inevitable contact resistance and to achieve the best possible results, copper is often used as the first choice of the metal bump material.

Generally speaking, copper is an ideal metal to serve as a metal bump material because it is not chemically active and has extremely low electric resistance. However, in some application cases, copper which serves as a metal bump material suffers serious damages due to the galvanic effect in the presence of extreme or abnormal conditions. This is adverse to the electronic circuits.

SUMMARY OF THE INVENTION

In the light of the above, the present invention first proposes a metal bump structure for use along with an anisotropic conductive film (ACF) bonding or in a driver IC (integrated circuit). This metal bump structure is basically indifferent to the galvanic effect in the presence of extreme or abnormal conditions.

The metal bump structure for use in a driver IC includes a metal pad, a passivation layer, an adhesion layer, a metal bump and a capping layer. The passivation layer is disposed on the metal pad and defines a recess disposed on the metal pad as well. The adhesion layer is completely disposed in the recess, disposed on the metal pad and partially disposed on the passivation layer so that the adhesion layer is in direct contact with the metal pad and with the passivation layer. The metal bump is partially disposed in the recess and almost covers the adhesion layer. The capping layer is disposed on the metal bump and almost completely covers the metal bump. The capping layer is capable of keeping the metal bump away from being exposed to an ambient atmosphere.

In one embodiment of the present invention, the metal bump is self-aligned to the adhesion layer.

In another embodiment of the present invention, the capping layer is self-aligned to the metal bump.

In another embodiment of the present invention, a notch is disposed among the capping layer, the adhesion layer and the passivation layer.

In another embodiment of the present invention, the metal bump includes Cu or Au.

In another embodiment of the present invention, the capping layer forms an alloy with the metal bump to keep the metal bump from penetrating the capping layer. The capping layer includes at least one of Sn, Ni, Au and Pd when the metal bump is Cu and the capping layer includes at least one of Sn, Ni and Pd when the metal bump is Au.

In another embodiment of the present invention, an interface of the capping layer and the metal bump is free of an alloy.

In another embodiment of the present invention, the metal bump structure is free of a galvanic effect in the presence of a high electric field or halogen.

In another embodiment of the present invention, the metal bump structure is used in a chip on glass (COG) package or in a chip on flex (COF) package.

The present invention further proposes a method for forming a metal bump structure for use in a driver IC. First, a substrate is provided. The substrate includes a metal pad, a passivation layer, an adhesion layer and a patterned photoresist. The passivation layer is disposed on the metal pad and defines a recess disposed on the metal pad. The adhesion layer is disposed in the recess, covers and directly contacts the metal pad and the passivation layer. The patterned photoresist is disposed on the adhesion layer and includes an opening exposing the adhesion layer which is disposed in the recess and on the passivation layer. Second, the opening is filled with a metal bump material. Then, the patterned photoresist is removed so that the metal bump material becomes a metal bump disposed on the adhesion layer. Next, the adhesion layer which is not covered by the metal bump is removed to partially expose the underlying passivation layer. Later, a capping layer is formed to almost completely cover the metal bump.

In one embodiment of the present invention, the capping layer is self-aligned to the metal bump.

In another embodiment of the present invention, the adhesion layer is over-removed to form a notch disposed among the capping layer, the adhesion layer and the passivation layer.

In another embodiment of the present invention, the metal bump includes Cu or Au.

In another embodiment of the present invention, the method further includes to cure the capping layer which is disposed on the metal bump to form an alloy with the metal bump to keep the metal bump from penetrating the capping layer. The capping layer includes at least one of Sn, Ni, Au and Pd when the metal bump is Cu and the capping layer includes at least one of Sn, Ni and Pd when the metal bump is Au.

In another embodiment of the present invention, the capping layer is formed to almost completely cover the metal bump without forming an alloy.

In another embodiment of the present invention, the metal bump is free of a galvanic effect in the presence of high electric field or halogen.

In another embodiment of the present invention, plating is used to fill the opening with the metal bump material.

In another embodiment of the present invention, electroless plating is used to form the capping layer.

These and other objectives of the present invention will no doubt become obvious to those of ordinary skill in the art after reading the following detailed description of the preferred embodiment that is illustrated in the various figures and drawings.

DETAILED DESCRIPTION

The present invention first provides a method for forming a metal bump structure for use in a driver IC, in a chip on glass (COG) package or in a chip on flex (COF) package. FIG. 1 to FIG. 8 illustrate a possible method to form the desirable metal bump structure. First, please refer to FIG. 1, a substrate 10 is provided. The substrate 10 includes a metal pad 11, a passivation layer 12 and an adhesion layer 13.

Figure 1:
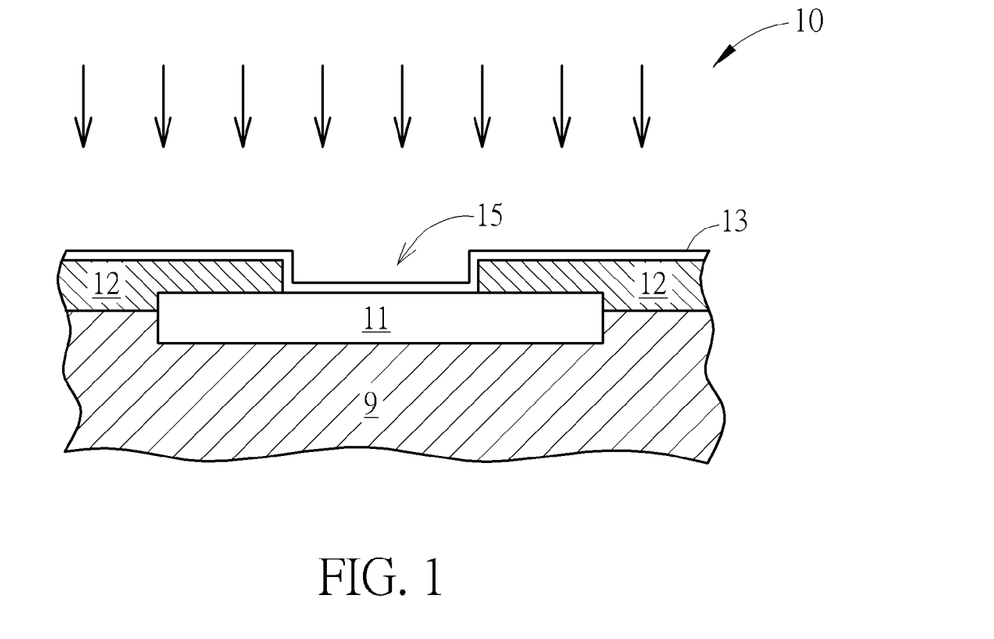
FIG. 1 to FIG. 8 illustrates procedures to form a metal bump structure of the present invention.

An insulating layer 9 is the basis of the substrate 10 to support other elements, such as the metal pad 11, the passivation layer 12, and the adhesion layer 13. The metal pad 11 may be a light weight material, such as Al, and patterned. However, other metal materials may be suitable.

The passivation layer 12 is disposed on the metal pad 11 and simultaneously has a pattern to define a recess 15 so the recess 15 is also disposed on the metal pad 11. The passivation layer 12 is an electric insulating material, such as silicon oxide, silicon nitride or the combination thereof. Generally speaking, the size of the recess 15 is smaller than the size of the metal pad 11.

The adhesion layer 13 is disposed in the recess 15. In addition, the adhesion layer 13 covers the metal pad 11 and the passivation layer 12 so the adhesion layer 13 may directly contact the metal pad 11 and the passivation layer 12. The adhesion layer 13 helps a later formed metal bump material (not shown) to firmly adhere to the recess 15. The adhesion layer 13 may be an alloy layer, such as TiW alloy layer or a Ti layer.

The adhesion layer 13 may be formed by sputtering a layer of Ti/W alloy and a seed layer such as copper to uniformly cover the substrate 10, for example to entirely cover the surface of the metal pad 11, the passivation layer 12 and the recess 15. The result is shown in FIG. 1.

Figure 2:
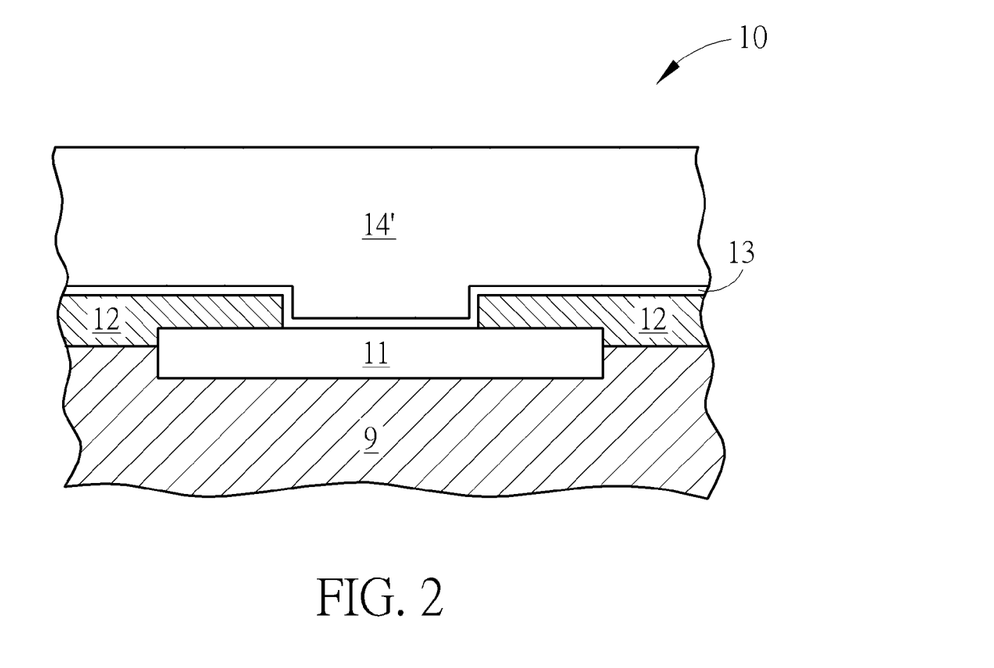

Next, as shown in FIG. 2, a bulk layer of photoresist 14' is formed on the adhesion layer 13 and to fill up the recess 15, too. The photoresist 14' may be a photosensitive material, such as an organic material.

Figure 3:
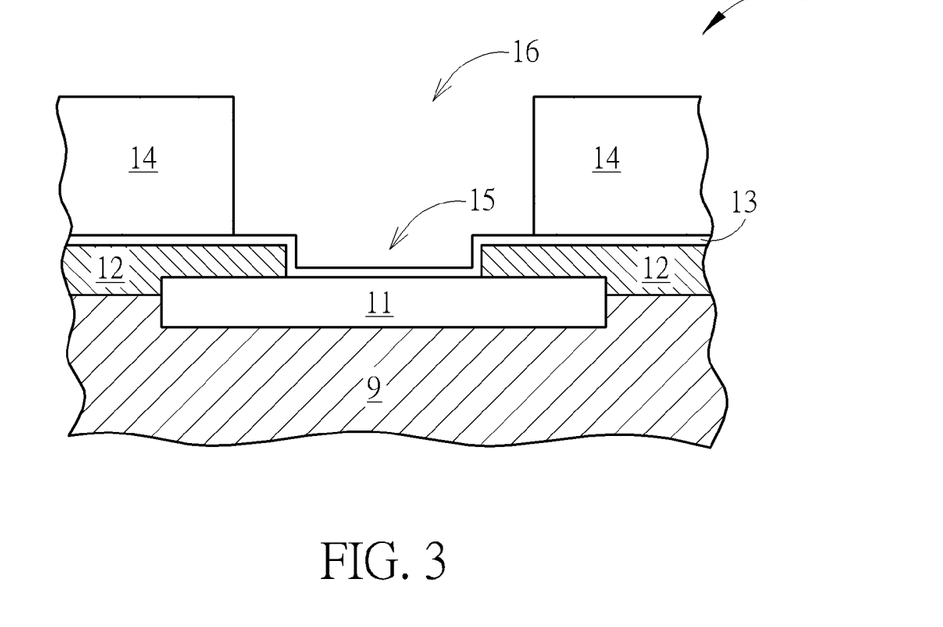

Afterwards, as shown in FIG. 3, the photoresist 14' is patterned. The patterned photoresist 14 may be formed as follows. For example, the patterned photoresist 14 is formed on the adhesion layer 13 to define an opening 16. The opening 16 is used to expose the adhesion layer 13 which is disposed in the recess 15 and on the passivation layer 12 so, in one embodiment of the present invention, the opening 16 is slightly larger than the recess 15. In other words, the opening 16 is used to define the space which the later formed metal bump material (not shown) is accommodated in. The space itself accommodates the recess 15, too.

Then, the bulk photoresist 14' undergoes a suitable exposure and development step to transform to a patterned photoresist 14 to have a pre-determined pattern which is formed by the suitable exposure and development steps. The pattern is defined by the opening 16 and the resultant structure is shown in FIG. 3.

Figure 4:
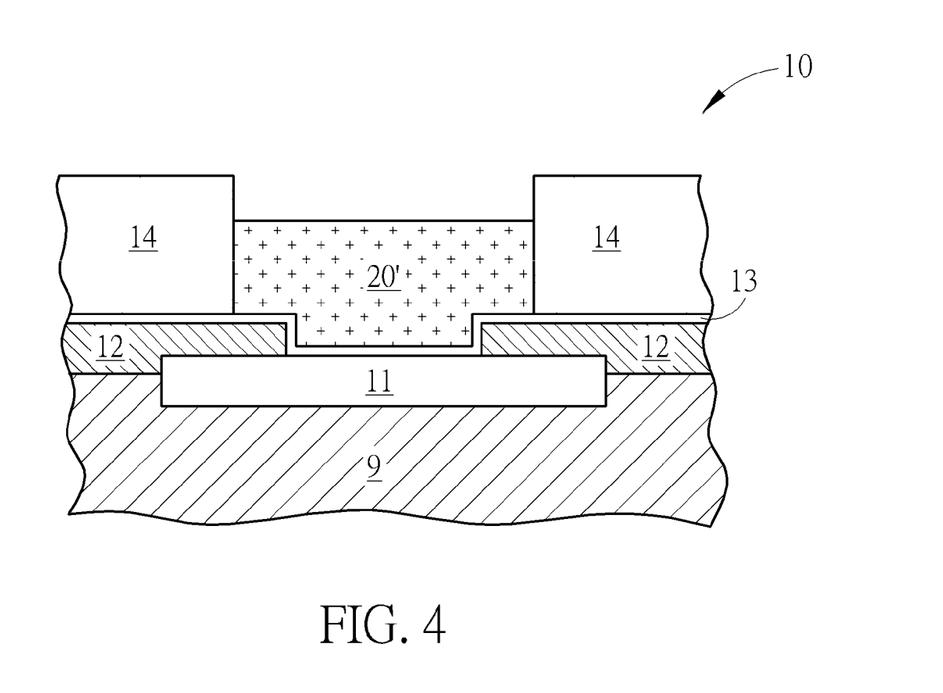
Figure 5:
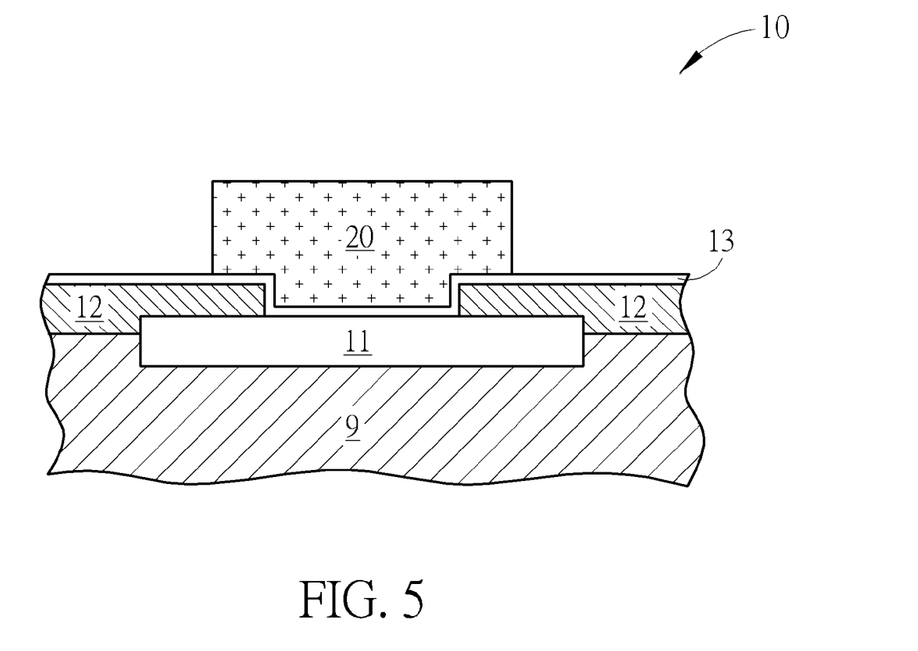

Second, as shown in FIG. 4, a metal bump material 20' is used to fill the opening 16. Please note that metal bump material 20' may merely "fill" the opening 16 but not "fill up" the opening 16. The adhesion layer 13 is sandwiched between the metal bump material 20' and the metal pad 11 or the passivation layer 12. For example, the metal bump material 20' is formed by plating because both the metal pad 11 and the adhesion layer 13 are electric conductive. Optionally, the metal bump material 20' may be palladium, silver, copper or gold to pursue an electric resistance and chemical activity as less as possible.

Once the metal bump material 20' is well constructed, the service of the photoresist 14' is no longer required. Then, please refer to FIG. 5, the patterned photoresist 14 is removed so that the metal bump material 20' becomes an individual metal bump 20. The patterned photoresist 14 may be removed conventionally. The individual metal bump 20 is completely disposed on and in direct contact with the adhesion layer 13.

Figure 6:
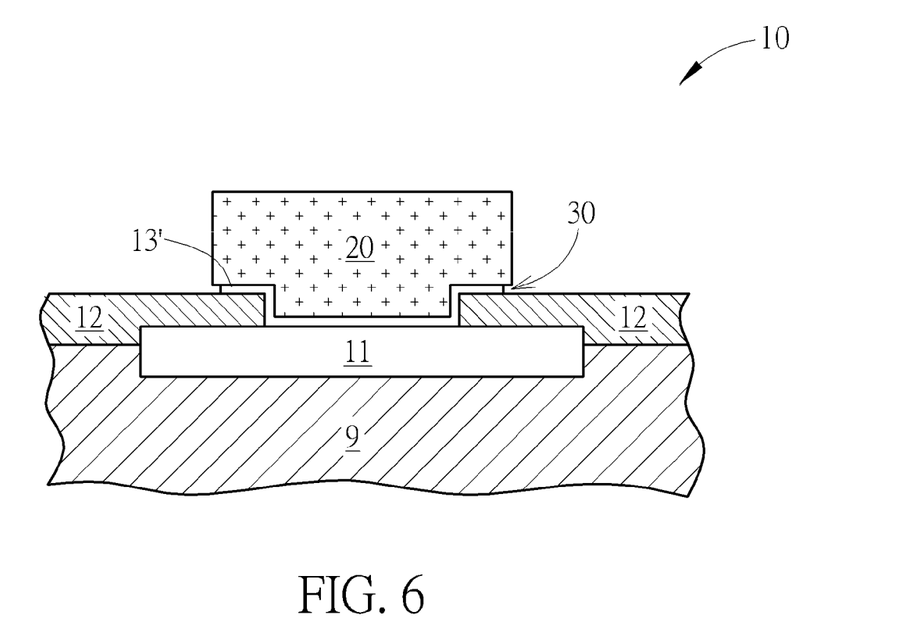

Because the adhesion layer 13 is electric conductive, it results in the individual metal bumps 20 shorting, so the excess adhesion layer 13 should be removed. Next, as shown in FIG. 6, the adhesion layer 13 which is not covered by the metal bump 20 is removed by an etching step to partially expose the underlying passivation layer 12 so that individual metal bumps 20 are electrically insulated from one another by the electrically insulating material, i.e. the passivation layer 12. In such a way, the metal bump 20 is self-aligned to the adhesion layer 13. The etching step to remove the adhesion layer 13 may use hydrogen peroxide to etch the TiW alloy.

Optionally, after the etching step, a curing step is needed to optionally adjust a hardness of the metal bump 20 by curing the metal bump 20. For example, the curing step is a thermal step with conditions such as greater than 300° C. or longer than 90 min. For example, a lower hardness requires higher temperature and longer time; higher hardness requires lower temperature and shorter time. The metal bump 20 is cured to have an ideal hardness, such as not more than 130 Hv, preferably not more than 110 Hv, more preferably between 110 Hv and 50 Hv.

Please pay attention to FIG. 6 that a notch 30 may be formed among the metal bump 20, the adhesion layer 13 and the passivation layer 12 when the adhesion layer 13 is removed because the etching step not only completely remove the adhesion layer 13 which is not covered by the metal bump 20, the etching step but also further removes the adhesion layer 13 other than this which is not covered by the metal bump 20, for example the adhesion layer 13 sandwiched between the metal bump 20 and the passivation layer 12. The result is that a notch 30 is formed among the metal bump 20, the adhesion layer 13 and the passivation layer 12, which is one of the structural features of the present invention. In the presence of the notch 30, the metal bump 20 may possibly almost cover the adhesion layer 13.

Because the individual metal bumps 20 are still susceptible to an ambient atmosphere, a capping layer is intentionally formed to cover the metal bump 20 as much as possible so that the metal bump 20 is not exposed to an ambient atmosphere. Please refer to FIG. 7, a capping layer 40 is formed to almost completely cover the metal bump 20 or further extend into the recess 30, as shown in FIG. 7A, to obtain the desirable metal bump structure 1 due the presence of the notch 30. The capping layer 40 may include various protective materials. In case of a Cu bump, the capping layer 40 may include at least one of Sn, Ni, Au and Pd. In case of an Au bump, the capping layer 40 may include at least one of Sn, Ni and Pd. In case of an Ag bump, the capping layer 40 may include Sn. In case of a Pd bump, the capping layer 40 may include Sn. However, the formation of the capping layer 40 may reduce the size of the notch 30 or would make the notch 30 vanish by filling it, as shown in FIG. 8, so the capping layer 40 is formed to completely cover the metal bump 20.

Preferably, the capping layer 40 may be formed by electroless plating. Since the passivation layer 12 is an electric insulating material, the capping layer 40 would be specifically formed on the metal bump 20. In other words, the capping layer 40 is self-aligned to the metal bump 20. In one embodiment of the present invention, the capping layer 40 is formed to completely cover the metal bump 20 without forming a collateral alloy layer in the absence of the notch 30, as shown in FIG. 8. The procedures for forming the capping layer 40 are listed in Table 1 for reference. Optionally, after each step in Table 1, a rinse step by pure water may be carried out.

TABLE 1

| Plating procedures | Temperature(° C.) | pH value | Time (second) |
|---|---|---|---|
| Bump cleaning step | Room temperature | Less than 7 | 30-60 |
| Acid treatment step | Room temperature | Less than 1 | 30-120 |
| Seed-activating step | Room temperature | 1.1-2 | 60-360 |
| Pd step | 50-54 | 6~8 | 600-1200 |
| Ni step | 50-54 | 6~8 | 600-1200 |
| Gold step | 85 | 4.7-5.3 | Less than 1200 |

Figure 9:
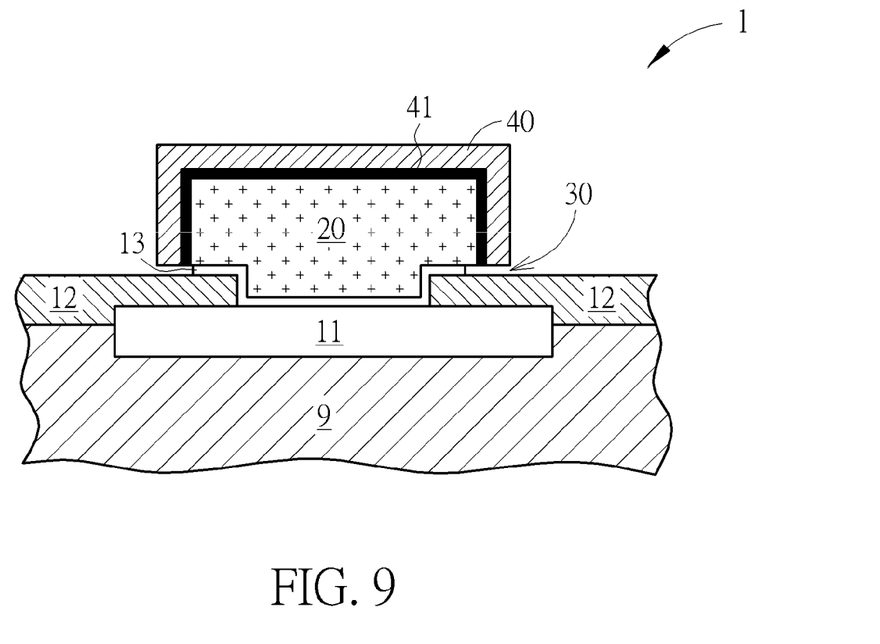
FIG. 9, FIG. 9A and FIG. 10 illustrates the metal bump structure of the present invention.
Figure 10:
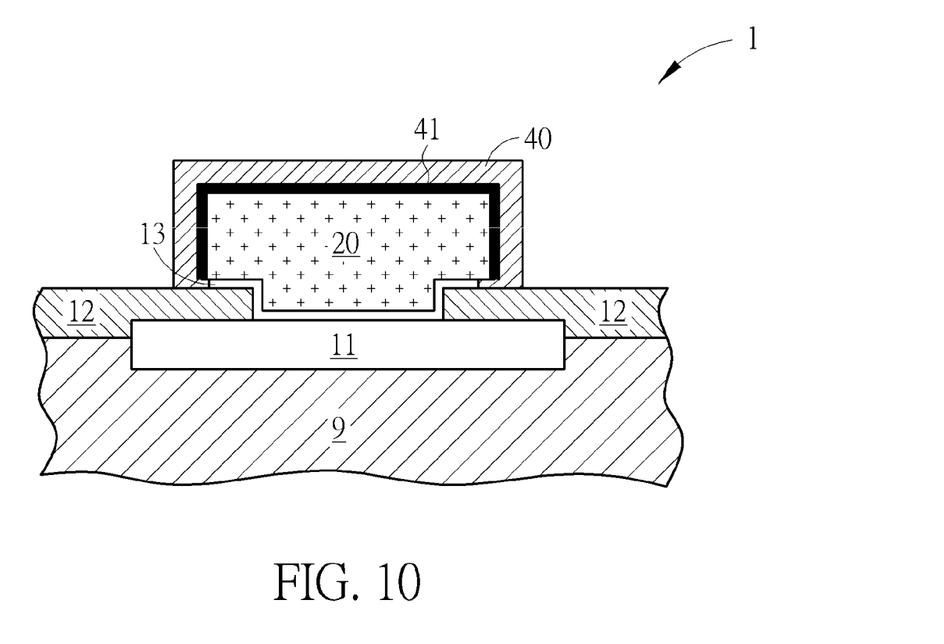

In another embodiment of the present invention, a curing step may be optionally employed to form an alloy. For example, as shown in FIG. 9 or FIG. 10, the capping layer 40 on the metal bump 20 is cured, for example around 150° C.~180° C. for 30~60 minutes, to form an alloy 41 with the metal bump 20. Copper and tin may form various alloy in different conditions, such as $Cu_3Sn$, $Cu_6Sn_5$, $Cu_{41}Sn_{11}$, or $Cu_{10}Sn_3$.

The alloy 41 is intentionally formed to keep the metal bump 20 from penetrating the capping layer 40 under extreme conditions. Under the protection of the capping layer 40 with or without the alloy 41, the metal bump 20 is free of a galvanic effect even in the presence of a high electric field and/or halogen. In FIG. 9, the metal bump 20 is cured to form the alloy 41 in the presence of the notch 30. In FIG. 10, the metal bump 20 is cured to form the alloy 41 in the absence of the notch 30.

After the above-mentioned steps, a metal bump structure 1 is obtained. The metal bump structure 1 may be employed in a chip on glass (COG) package or in a chip on flex (COF) package. As a result, the present invention also provides a metal bump structure 1 for use in a driver IC. Please refer to FIG. 9 or FIG. 10, which illustrates the metal bump structure 1 of the present invention. The metal bump structure 1 of the present invention includes at least a metal pad 11, a passivation layer 12, an adhesion layer 13, a metal bump 20, a capping layer 40 and an optional alloy layer 41. The metal pad 11 may be a light weight material, such as Al, and patterned. However, other metal materials may be suitable, too.

The passivation layer 12 is disposed on the metal pad 11 and simultaneously has a pattern to define a recess 15 so the recess 15 is also disposed on the metal pad 11. The passivation layer 12 is an electric insulating material such as silicon oxide, silicon nitride or the combination thereof. Normally, the size of the recess 15 is smaller than the size of the metal pad 11.

The adhesion layer 13 is completely disposed in the recess 15. In addition, the adhesion layer 13 is also disposed on the metal pad 11 to cover and directly contact the metal pad 11. However, the adhesion layer 13 is partially disposed on the passivation layer 12 to cover and directly contact the passivation layer 12. The adhesion layer 13 helps the metal bump 20 to firmly adhere to the recess 15. The adhesion layer 13 may be an alloy layer, such as TiW alloy layer.

The metal bump 20 is partially disposed in the recess 15 but may almost cover the adhesion layer 13 so that the adhesion layer 13 is sandwiched between the metal bump 20 and the metal pad 11 as well as the passivation layer 12. In particular, the metal bump 20 is self-aligned to the adhesion layer 13. Optionally, the metal bump 20 may be Pd, Ag, Cu or Au to pursue an electric resistance and chemical activity as less as possible.

Figure 7:
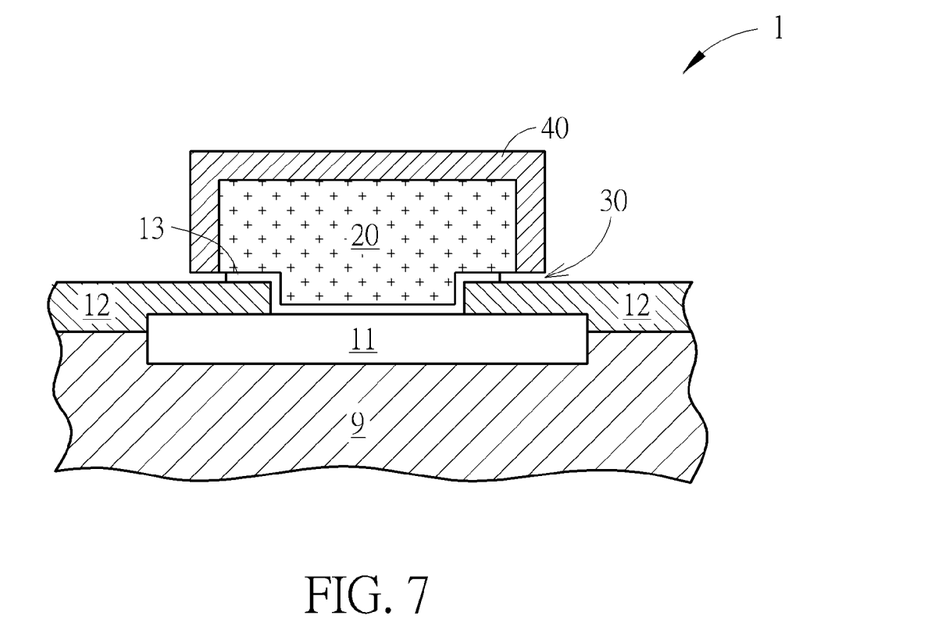
Figure 7A:
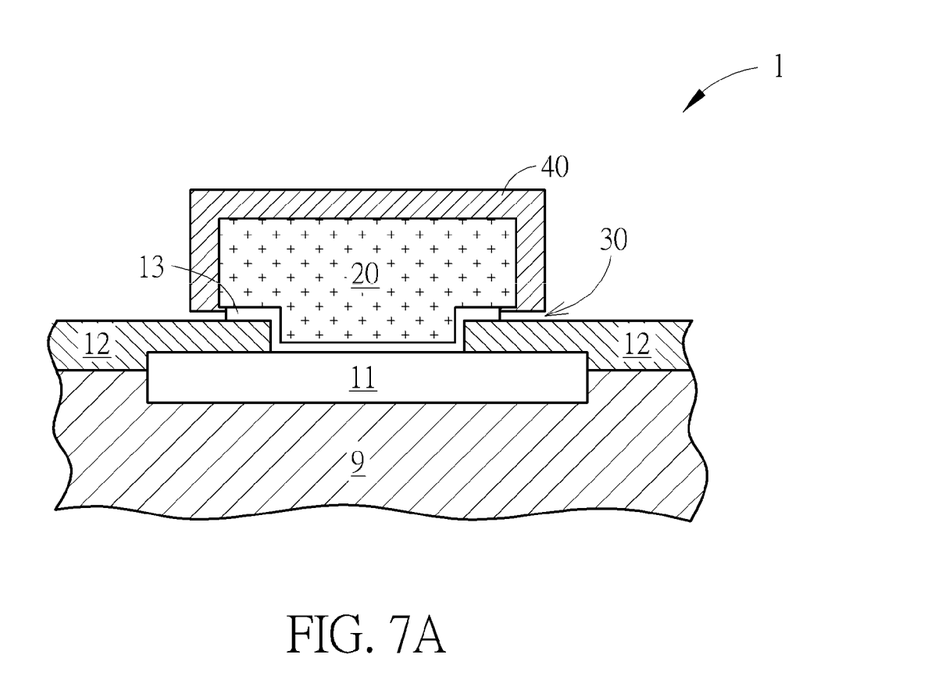
FIG. 7A illustrates a desirable metal bump structure with a notch.
Figure 8:
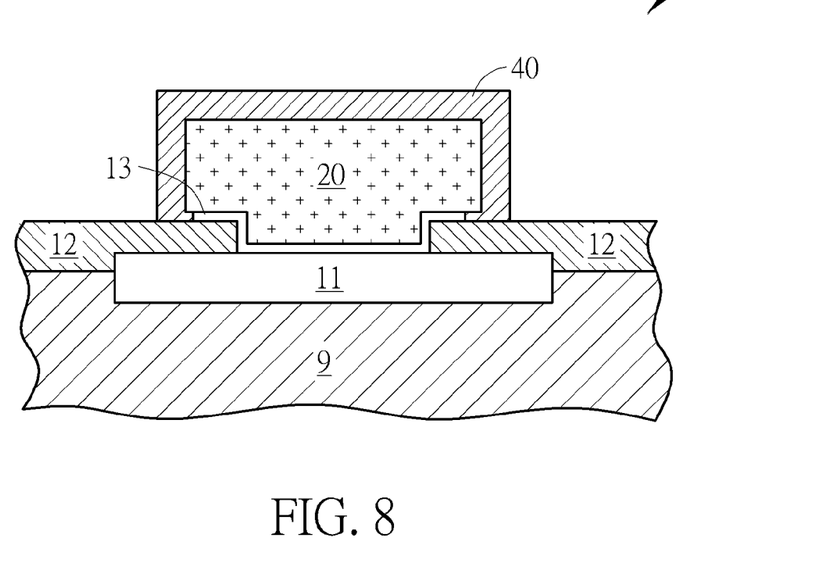

The capping layer 40 is disposed on the metal bump 20 to almost completely cover the metal bump 200, as shown in FIG. 7, or to completely cover the metal bump 20 and further to extend into the recess 30, as shown in FIG. 7A, so that the capping layer 40 is capable of keeping the metal bump 20 away from being exposed to an ambient atmosphere. In other words, the capping layer 40 may be self-aligned to the metal bump 20.

In particular, please pay attention to one of the structural features of the present invention in both FIG. 7 and FIG. 9 that a notch 30 is formed among the metal bump 20, the adhesion layer 13 and the passivation layer 12 so that the notch 30 may serve as an opening to partially expose the adhesion layer 13.

The capping layer 40 is used to completely cover the metal bump 20 so that the metal bump 20 is not exposed to an ambient atmosphere. The capping layer 40 may include various materials. In case of a Cu bump, the capping layer 40 may include at least one of Sn, Ni, Au and Pd, to form Sn, Ni/Au, Ni/Pd/Au or Pd/Au. In case of an Au bump, the capping layer 40 may include at least one of Sn, Ni and Pd to form Sn/Ni/Au, Au/Pd/Ni, Au/Ni/Pd. In case of an Ag bump, the capping layer 40 may include Sn. In case of a Pd bump, the capping layer 40 may include Sn. Please note that a thicker capping layer 40 may reduce the size of the notch 30 or would make the notch 30 disappear, as shown in FIG. 8 or FIG. 10.

Figure 9A:
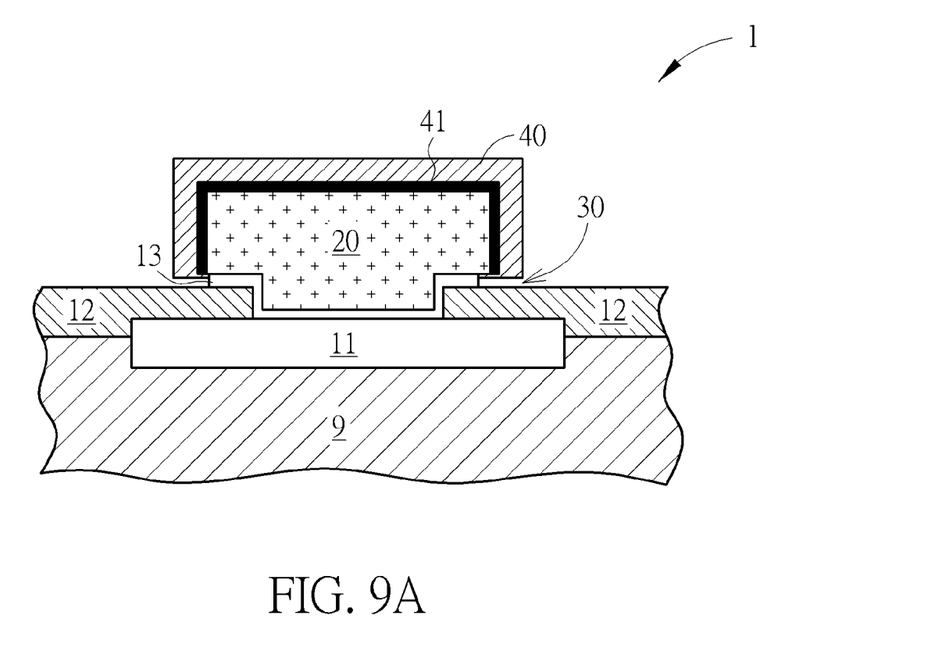

Since the capping layer 40 is specifically formed on the metal bump 20, the capping layer 40 is self-aligned to the metal bump 20. In one embodiment of the present invention, the capping layer 40 is formed to completely cover the metal bump 20 without forming an alloy, as shown in FIG. 7 or in FIG. 8. In another embodiment of the present invention, the capping layer 40 on the metal bump 20 may form an alloy 41 with the metal bump 20, as shown in FIG. 9, FIG. 9A or in FIG. 10.

When the alloy 41 is present, as shown in FIG. 9 or in FIG. 10, Cu, Sn, Ni, Ag, Au and Pd may form various alloys. For example, Cu and Sn may form alloys such as $Cu_3Sn$, $Cu_6Sn_5$, $Cu_{41}Sn_{11}$, or $Cu_{10}Sn_3$. Specifically speaking, the alloy 41 is intentionally formed to keep the metal bump 20 from penetrating the capping layer 40 under extreme conditions. Under the protection of the capping layer 40 with or without the alloy 41, the metal bump is free of a galvanic effect in the presence of high electric field and/or halogen.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A metal bump structure for use in a driver IC, comprising:
   a metal pad;
   a passivation layer disposed on said metal pad and defining a recess disposed on said metal pad;

an adhesion layer disposed in said recess, disposed on said metal pad and partially disposed on said passivation layer, wherein said adhesion layer is in direct contact with said metal pad and with said passivation layer;

a metal bump partially disposed in said recess and covering said adhesion layer; and a capping layer disposed on said metal bump and covering said metal bump so that said metal bump is not exposed to an ambient atmosphere, wherein a notch is surrounded by said capping layer, by said adhesion layer and by said passivation layer and disposed beneath said metal bump.

2. The metal bump structure for use in a driver IC of claim 1, wherein said metal bump is self-aligned to said adhesion layer.

3. The metal bump structure for use in a driver IC of claim 1, wherein said capping layer is self-aligned to said metal bump.

4. The metal bump structure for use in a driver IC of claim 1, wherein said metal bump comprises one of Cu and Au.

5. The metal bump structure for use in a driver IC of claim 1, wherein an interface of said capping layer and said metal bump is free of an alloy.

6. The metal bump structure for use in a driver IC of claim 4, wherein said capping layer comprises at least one of Sn, Ni, Au and Pd when said metal bump is Cu and said capping layer comprises at least one of Sn, Ni and Pd when said metal bump is Au.

7. The metal bump structure for use in a driver IC of claim 1, to be free of a galvanic effect in the presence of at least one of a high electric field and halogen.

8. The metal bump structure for use in a driver IC of claim 1 in one of a chip on glass (COG) package and a chip on flex (COF) package.

9. A method for forming a metal bump structure for use in a driver IC, comprising:

providing a substrate comprising:
a metal pad;
a passivation layer disposed on said metal pad and defining a recess disposed on said metal pad;
an adhesion layer disposed in said recess, covering and directly contacting said metal pad and said passivation layer; and
a patterned photoresist disposed on said adhesion layer and comprising an opening exposing said adhesion layer disposed in said recess and on said passivation layer;

filling said opening with a metal bump material;

removing said patterned photoresist so that said metal bump material becomes a metal bump disposed on said adhesion layer;

removing said adhesion layer which is not covered by said metal bump to partially expose underlying said passivation layer and curing said metal bump to adjust its hardness, wherein said adhesion layer is over-removed to form a notch disposed among said capping layer, said adhesion layer and said passivation layer when removing said adhesion layer; and forming a capping layer to cover said metal bump.

10. The method for forming a metal bump structure for use in a driver IC of claim 9, wherein said capping layer is self-aligned to said metal bump.

11. The method for forming a metal bump structure for use in a driver IC of claim 9, wherein said metal bump comprises one of Cu and Au.

12. The method for forming a metal bump structure for use in a driver IC of claim 9, wherein forming a capping layer to completely cover said metal bump without forming an alloy.

13. The method for forming a metal bump structure for use in a driver IC of claim 12, wherein said capping layer comprises at least one of Sn, Ni, Au and Pd when said metal bump is Cu and said capping layer comprises at least one of Sn, Ni and Pd when said metal bump is Au.

14. The method for forming a metal bump structure for use in a driver IC of claim 9, wherein said metal bump is free of a galvanic effect in the presence of both high electric field and halogen.

15. The method for forming a metal bump structure for use in a driver IC of claim 9, wherein filling said opening with said metal bump material is performed by plating.

16. The method for forming a metal bump structure for use in a driver IC of claim 9, wherein forming said capping layer is performed by electroless plating.

* * * * *